United States Patent [19]
Eisch et al.

[11] Patent Number: 5,100,693
[45] Date of Patent: Mar. 31, 1992

[54] PHOTOLYTIC DEPOSITION OF METAL FROM SOLUTION ONTO A SUBSTRATE

[75] Inventors: John J. Eisch, Vestal; Marek P. Boleslawski, Binghamton, both of N.Y.

[73] Assignee: The Research Foundation of State University of New York, Albany, N.Y.

[21] Appl. No.: 533,543

[22] Filed: Jun. 5, 1990

[51] Int. Cl.[5] .................. B05D 3/06; B05D 5/12; G03C 5/00
[52] U.S. Cl. .................. 427/54.1; 427/53.1; 427/98; 427/123; 427/125; 430/417
[58] Field of Search .......... 427/53.1, 54.1, 55, 427/56.1, 123, 125, 96, 97, 98, 304, 305, 306; 430/417, 416, 335, 336

[56] References Cited

U.S. PATENT DOCUMENTS

| | | | |
|---|---|---|---|
| 3,772,056 | 11/1973 | Polichetto et al. | 427/125 |
| 3,904,783 | 9/1975 | Nara et al. | 427/98 |
| 4,006,269 | 2/1977 | Kerfoot | 427/98 |
| 4,084,023 | 4/1978 | Dafter, Jr. | 427/98 |
| 4,098,922 | 7/1978 | Dinella et al. | 427/54.1 |
| 4,268,536 | 5/1981 | Beckenbaugh et al. | 427/54.1 |
| 4,560,643 | 12/1985 | Finter et al. | 427/98 |
| 5,045,348 | 9/1991 | Brierley et al. | 427/54.1 |

Primary Examiner—Marianne Padgett
Attorney, Agent, or Firm—Richard P. Fennelly; Louis A. Morris

[57] ABSTRACT

Metal is photolytically deposited from solution onto a substrate in contact with the solution by irradiating with light a solution containing a solubilized metal source and an organic compound containing a plurality of proximal Lewis base substituent groups so as to be capable of promoting the photoreduction of the metal onto the substrate.

10 Claims, No Drawings

PHOTOLYTIC DEPOSITION OF METAL FROM SOLUTION ONTO A SUBSTRATE

BACKGROUND OF THE INVENTION

K. A. Jones in "Laser Assisted MOCVD Growth", in *Solid State Technology*, 28(10), 151–156 (1985) indicates that metals can be deposited by allowing molecules to absorb ultraviolet light citing the earlier work of T. F. Deutsch et al. in Appl. Phys. Lett. 1979, 35(2), 175–177. The laser photodeposition of metal films by Deutsch et al. utilized the ultraviolet laser-induced photodissociation of organometallic compounds to yield features smaller than 2 microns. Deutsch et al. use trimethylaluminum and dimethylcadmium as parent gases from which aluminum or cadmium were deposited. They also employed a methyltin and $CF_3I$ to deposit tin and iodine.

U.S. Pat. Nos. 4,559,237 and 4,619,838 indicate that various inorganic metal species in the form of either simple or complex salts can be deposited onto semiconductor powders by means of a photoredox reaction by irradiation of a suspension of a semiconductor powder in the presence of oxygen and, optionally, carbon dioxide in an oxidizable system (e.g., water, an alkanol, an ether, etc.) which protects the semiconductor from photocorrosion.

Japanese Patent Publication Nos. 243279/1985 and 243280/1985 prepare transparent electrodes by forming an electrode-forming solution of a non-hydrolyzable organic metal compound containing indium and tin (e.g., trisacetylacetonatoindium and bis-acetylacetonatodibutyltin), an organic binder (e.g., a cellulose), and a solvent (e.g., a high boiling solvent to form a paste for screen printing or a low boiling solvent for a dipping solution). The desired substrate is treated with the solution and irradiated with ultraviolet radiation. The resulting ozone which is produced causes organic chain decomposition and forced oxidation of the solution thereby facilitating the burning of its organic components so that a film of uniform quality is formed.

Japanese Patent Publication No. 50172/1985 describes dipping an electrically non-conductive substance carrying a semiconductor on its surface into a solution containing metal ions derived from inorganic metal salts. The semiconductor is excitable by visible and/or ultraviolet light. An electron donor can be used to assist in the injection of electrons into the semiconductor when the latter is excited by light and the metal ions are reduced to the metal state. This reference describes the use of electron donor compounds such as ammonia, amines, alcohols, aldehydes, ketones, ethers, sulfoxides and amides to enable the injection of electrons into the semiconductor. Preferred examples are identified as being ammonia, methylamine, methanol, and ethanol.

Japanese Patent Publication No. 133076/1987 describes a process for forming metal-plated inorganic substances by dispersing an inorganic substance in a solution containing ions of a catalytic metal (e.g., derived from palladium chloride) and a reaction assistant (or reducing agent), irradiating the dispersion with light to cause reduction of the ions so that the catalytic metal may be deposited on the surface of the inorganic substance and then plating the surface of the inorganic substance with a metal electrolessly. Various reducing agents are identified as reaction assistants including alcohols, aldehydes, sugars, amines (e.g., ethylamine, benzylamine, and aniline), organic acids, and oxoacid salts containing either phosphorus, sulfur or nitrogen.

A series of publications by Y. L. Chow et al. (e.g., *J. Chem. Soc. Perkin Trans. II* 1986, pp. 365–369 and the citations therein) relate to the photoreduction of bis-(acetylacetonato)copper(II) and nickel (II) using benzene or certain high triplet energy ketones, e.g., xanthen-9-one, benzophenone, or acetophenone.

SUMMARY OF THE INVENTION

The invention relates to the substantially photolytic reduction of metal species contained in solution onto a substrate in contact with the solution utilizing a novel class of photosensitizer. The photosensitizer used herein is an organic compound containing a plurality of proximal Lewis base groups capable of metal coordination.

DETAILED DESCRIPTION OF THE INVENTION

The instant process involves the formation of an appropriate solution containing dissolved metal species derived from either metal-organic compounds or inorganic salts and an organic compound capable of coordination with the metal and of promoting the photoreduction of the metal onto a substrate which is in contact with the solution. The term "metal-organic" as used herein is intended to connote species containing metal and organo components. Organometallic compounds containing a direct metal to carbon bond are one class of compounds which may be used.

The solvent which is used for the instant invention is advantageously substantially free of water and free oxygen. Methanol has proven to be useful. It is within the contemplation of the instant invention to use other alcohols as well as other organic solvents such as ethers, and certain aromatic and aliphatic hydrocarbon solvents (e.g., toluene and hexane).

The dissolved metal species which can be used herein is one which can be selected from a variety of sources. One source is the metal acetylacetonate compounds including those of such transition metals as copper(II), cobalt(II), nickel(II), platinum(II), palladium(II), silver(I), zinc(II), and the like. Use of such a source gives a 1,3-dicarbonyl complex of the selected metal. Another source for the dissolved metal species can be such inorganic metal salts as the soluble halides, sulfates, and the like, of such metals as copper, cobalt, nickel, iron, platinum, palladium, silver, zinc, and the like. Generally, the concentration of the metal species can be from about 3 mmol/L to about 50 mmol/L.

The organic compound responsible for appropriate promotion of the photoreduction of the foregoing solubilized metal source in the type of solvent medium earlier described can be thought of as an organic compound having a plurality of Lewis base substituents which render the compound capable of coordination with the metal species in solution. Examples of such organic promoters for the photoreduction process are represented by compounds containing vicinal Lewis base substituents. More particularly, compounds of the formula

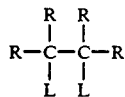

where R is organo (such as alkyl, aryl, or the like) and L is the Lewis base group (e.g., —OH, —NH$_2$, —SH, and the like) have been found to be effective. The respective L groups are preferably vicinal to one another. For example, of the pinacols (L=OH), it has been found that benzpinacol is an effective promoter. N,N',1,2-tetraphenylethylenediamine is an example of an effective diamine photoreduction promoter. Generally, the amount of promoter used can range from about 0.05 mmol/L to about 100 mmol/L.

The instant invention can be used to deposit metal films and can be used in regard to the following: the resulting highly active metal films can serve as catalysts or stoichiometric reagents for a wide variety or organic chemical reactions, such as the oxidation of alcohols to aldehydes or ketones, the cyclopropanation of olefins with methylene halides, the coupling of aryl halides to biaryls, the intermolecular hydrogen transfer between hydrocarbons and the desulfurization of organosulfur compounds.

The invention is further understood by the Examples which follow.

EXAMPLE 1

The reaction solution for photochemical copper deposition was prepared by placing 50.0 mL of a saturated solution of copper(II) acetylacetonate in dry, oxygen-free methanol into a quartz tube containing 1.0 g of meso-N,N',1,2-tetra-phenylethylenediamine as a photosensitizer under a protecting atmosphere of inert gas. The reactor-tube was briefly connected to vacuum, refilled with nitrogen, closed and then placed into the UV-chamber. The UV-chamber contained eight ultraviolet lamps (8 watts each) disposed in a cylindrical array. The contents of the reactor-tube were irradiated at 185-254 nm for 18 hours. After 18 hours the reactor-tube was removed from the UV-chamber. The inner wall of tube was coated with a copper metal film.

EXAMPLE 2

The reaction solution for photochemical copper deposition was prepared by placing 50.0 mL of a saturated solution of copper(II) acetylacetonate in dry, oxygen-free methanol into a quartz tube containing 0.5 g of meso-N,N',1,2-tetraphenylethylenediamine as a photosensitizer under a protecting atmosphere of inert gas. The reactor-tube was briefly connected to vacuum, refilled with nitrogen, closed and then placed into the UV-chamber. The contents of the reactor-tube were irradiated at 300 nm for 18 hours. After 18 hours the reactor-tube was removed from the UV-chamber. The inner wall of the tube was coated with a copper metal film.

EXAMPLE 3

The reaction solution for photochemical copper deposition was prepared by placing 50.0 mL of a saturated solution of copper(II) acetylacetonate in dry, oxygen-free methanol into a quartz tube containing 0.25 g of meso-N,N',1,2-tetraphenylethylenediamine as a photosensitizer under a protecting atmosphere of inert gas. The reactor-tube was briefly connected to vacuum, refilled with nitrogen, closed and then placed into the UV-chamber. The contents of the reactor-tube were irradiated at 254 nm for 18 hours. After 18 hours the reactor-tube was removed from the UV-chamber. The inner wall of tube was coated with a copper metal film.

COMPARATIVE EXAMPLE 4

No photosensitizer was used in this Example.

The reaction solution for photochemical copper deposition was prepared by placing 50.0 mL of a saturated solution of copper(II) acetylacetonate in dry, oxygen-free methanol into a quartz tube. The reactor-tube was briefly connected to vacuum, refilled with nitrogen, closed and then placed into the UV-chamber. The contents of the reactor-tube were irradiated at 185-254 nm for 3 hours. After 3 hours the reactor-tube was removed from the UV-chamber. No copper metal film was detected on the inner wall of tube. Irradiation was continued for an additional 15 hours. After a total of 18 hours of irradiation, only a trace of metallic copper deposition was detected.

COMPARATIVE EXAMPLE 5

No photosensitizer was used in this Example.

The reaction solution for photochemical copper deposition was prepared by placing 50.0 mL of a saturated solution of copper(II) acetylacetonate in dry, oxygen-free methanol into a quartz tube. The reactor-tube was briefly connected to vacuum, refilled with nitrogen, closed and then placed into the UV-chamber. The contents of the reactor-tube were irradiated at 300 nm for 18 hours. After 18 hours the reactor-tube was removed from the UV-chamber. No trace of copper metal film was detected on the inner wall of tube.

COMPARATIVE EXAMPLE 6

Water was introduced in this Example.

The reaction solution for photochemical copper deposition was prepared by placing 50.0 mL of a saturated solution of copper(II) acetylacetonate in dry, oxygen-free methanol into a quartz tube containing 0.25 g of meso-N,N',1,2-tetraphenylethylenediamine as a photosensitizer. Additionally 2.0 mL of water was introduced to the reactor-tube. The reactor-tube was briefly connected to vacuum, refilled with nitrogen, closed and then placed into the UV-chamber. The contents of the reactor-tube were irradiated at 185-254 nm for 18 hours. After 18 hours the reactor-tube was removed from the UV-chamber. No trace of copper metal film was detected on the inner wall of tube.

EXAMPLE 7

The reaction solution for photochemical copper deposition was prepared by placing 0.100 g of copper(II) acetylacetonate and 0.100 g of meso-N,N',1,2-tetraphenylethylenediamine into a quartz tube. The reactor-tube was briefly connected to vacuum, refilled with nitrogen and closed by a rubber septum. Then 12 mL of dry, oxygen-free methyl alcohol was introduced to the reactor-tube. The reactor-tube was placed in the UV-chamber and irradiated at 185-254 nm for 18 hours. After 18 hours the reactor-tube was removed from the UV-chamber. The inner wall of tube was coated with a copper metal film.

EXAMPLE 8

In the experimental condition as described in Example 7, methanol was replaced by 12 mL of dry, oxygen-free ethanol. After irradiation by UV light at 254 nm, copper metal film deposition was observed.

EXAMPLE 9

In the experimental condition as described in Example 7, methanol was replaced by 12 mL of dry, oxygen-free propanol. After irradiation by UV light at 254 nm copper metal film deposition was observed.

EXAMPLE 10

The reaction solution for photochemical metal film deposition was prepared by placing 0.100 g of cobalt(II) acetylacetonate and 0.100 g of meso-N,N',1,2-tetraphenylethylenediamine into a quartz tube. The reactor-tube was briefly connected to vacuum, refilled with nitrogen and closed by rubber septum. Then 12 mL of dry, oxygen-free methyl alcohol was introduced to the reactor-tube. The reactor-tube was placed in the UV-chamber and irradiated at 185-254 nm for 18 hours. After 18 hours the reactor-tube was removed from the UV-chamber. The inner wall of tube was coated with the cobalt metal film.

EXAMPLE 11

The reaction solution for photochemical metal film deposition was prepared by placing 0.100 g of nickel(II) acetylacetonate and 0.100 g of meso-N,N',1,2-tetraphenylethylenediamine into a quartz tube. The rest of the procedure was carried out as described in Example 10. The traces of metallic nickel film were observed on the inner wall of tube.

EXAMPLE 12

The reaction solution for photochemical metal film deposition was prepared by placing 0.040 g of platinum-(II) acetylacetonate and 0.070 g of meso-N,N',1,2-tetraphenylethylenediamine into a quartz tube. The rest of the procedure was carried out as described in Example 10. The metallic platinum film was observed on the inner wall of tube.

EXAMPLE 13

The reaction solution for photochemical metal film deposition was prepared by placing 0.030 g of palladium(II) acetylacetonate and 0.070 g of meso-N,N',1,2-tetraphenylethylenediamine into a quartz tube. The rest of the procedure was carried out as described in Example 10. The metallic palladium film was observed on the inner wall of tube.

EXAMPLE 14

In the experimental condition as described in Example 7, 0.030 g of silver(I) acetylacetonate has been used instead of copper(II) acetylacetonate and 10.0 mL of methanol. After irradiation by UV light at 254 nm, silver metal film deposition was observed.

EXAMPLE 15

In the experimental condition as described in Example 7, 0.030 g of silver(I) acetylacetonate, 0.071 g of meso-N,N', 1,2-tetraphenylethylenediamine and 10.0 mL of methanol has been used. After irradiation by UV light at 254 nm, silver metal film deposition was observed.

EXAMPLE 16

The reaction was carried out as described in Example 12 using 0.100 g of copper(II) chloride. After irradiation by UV light at 185-254 nm, copper metal film deposition was observed.

EXAMPLE 17

The reaction was carried out as described in Example 12 using 0.100 g of copper(I) chloride. After irradiation by UV light at 185-254 nm, copper metal film deposition was observed.

EXAMPLE 18

The reaction was carried out as described in Example 12 using 0.100 g of copper(II) bromide. After irradiation by UV light at 185-254 nm, copper metal film deposition was observed.

EXAMPLE 19

The reaction was carried out as described in Example 12 using 0.100 g of copper(II) iodide. After irradiation by UV light at 185-254 nm, copper metal film deposition was observed.

EXAMPLE 20

The reaction was carried out as described in Example 12 using 0.100 g of copper(II) sulfate. After irradiation by UV light at 185-254 nm, copper metal film deposition was observed.

EXAMPLE 21

The experiment was carried out as described in Example 12. The 10 mL of dimethoxyethane has been used instead of methyl alcohol. Copper metal film was observed.

EXAMPLE 22

The reaction was carried out as described in Example 12 using 0.100 g of nickel(II) acetylacetonate as a source of metal. The deposition of metallic nickel film was observed.

EXAMPLE 23

The reaction was carried out as described in Example 12 using 0.100 g of zinc(II) acetylacetonate as a source of metal. The deposition of metallic zinc film was observed.

EXAMPLE 24

This Example illustrates the amount of copper deposited on the inner surfaces of a tube holding the solution described below under the conditions described below for two of the photosensitizers described hereinabove.

The method involved the radiation, from the outside of the tube, with a 185-254 nm light source (2% intensity at 185 nm) of a saturated solution in 10 mL methanol (substantially free of oxygen and water) of copper-(II) acetylacetonate (52 mmol) and the photosensitizer selected (0.5 mmol). The total irradiation time was twenty-four hours.

At the end of this period, the residual solution was decanted, the surface containing the film was washed with acetone, the deposited copper film was dissolved in 30% nitric acid, and the resulting solution was titrated with ethylenediaminetetraacetic acid solution to determine the copper deposited on the tube in % by weight based on metal amount in the metal salt used in the reaction.

The following results were observed:

| Photosensitizer | % |
|---|---|
| Benzpinacol | 21.5 |
| Tetraphenylethylenediamine | 33.0 |

For comparative purposes, the following results were achieved with other compounds falling outside the description of the photoreduction promoters of the instant invention:

| Compound | % |
|---|---|
| Aniline | <1 |
| Glucose | 5.5 |
| Fructose | 3.0 |

The foregoing Examples have been presented for illustrative reasons only and should not be construed in a limiting sense. The scope of protection sought is set forth in the claims which follow.

We claim:

1. A process for the substantially photolytic deposition of a metal from a substantially anhydrous solution onto a substrate which comprises the irradiation with light of a solution consisting essentially of a solvent, a solubilized metal source and, as photosensitizer an organic compound containing a plurality of proximal Lewis base groups capable of coordination with the metal species so as to be capable of promoting the photoreduction of the metal onto the substrate when the solution is in contact with the substrate.

2. A process as claimed in claim 1 wherein the solubilized metal source is a 1,3-dicarbonyl complex of the metal.

3. A process as claimed in claim 1 wherein the compound capable of promoting the photoreduction is a vicinal diamine.

4. A process as claimed in claim 1 wherein the solution is substantially anhydrous and the solubilized metal source is a dicarbonyl complex of the metal.

5. A process as claimed in claim 4 wherein the compound capable of promoting the photoreduction is an aromatic substituted vicinal diamine.

6. A process as claimed in claim 1 wherein the compound capable of promoting the photoreduction is a pinacol.

7. A process as claimed in claim 6 wherein the pinacol is an aromatic substituted pinacol.

8. A process as claimed in claim 3 wherein the vicinal diamine is an aromatic diamine.

9. A process as claimed in claim 5 wherein the vicinal diamine is an aromatic diamine.

10. A process as claimed in claim 1 wherein the organic compound is an aromatic vicinal diamine.

* * * * *